(12) United States Patent
Liu et al.

(10) Patent No.: US 9,213,241 B2
(45) Date of Patent: Dec. 15, 2015

(54) METHOD OF MAKING NANOSTRUCTURE

(71) Applicants: Tsinghua University, Beijing (CN); HON HAI PRECISION INDUSTRY CO., LTD., New Taipei (TW)

(72) Inventors: Jun-Ku Liu, Beijing (CN); Meng-Xin Ren, Beijing (CN); Li-Hui Zhang, Beijing (CN); Mo Chen, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/242,876

(22) Filed: Apr. 2, 2014

(65) Prior Publication Data

US 2014/0356791 A1  Dec. 4, 2014

(30) Foreign Application Priority Data

May 30, 2013 (CN) .......................... 2013 1 02090101

(51) Int. Cl.
| | |
|---|---|
| G03F 7/20 | (2006.01) |
| G03F 7/40 | (2006.01) |
| H01L 29/06 | (2006.01) |
| H01L 21/20 | (2006.01) |

(52) U.S. Cl.
CPC ............ *G03F 7/2059* (2013.01); *G03F 7/2037* (2013.01); *G03F 7/40* (2013.01); *H01L 21/20* (2013.01); *H01L 29/06* (2013.01)

(58) Field of Classification Search
CPC ....... H01L 21/20; H01L 29/06; G03F 7/2037; G03F 7/2059; G03F 7/40
USPC .................................. 430/296, 314, 315, 942
See application file for complete search history.

(56) References Cited

U.S. PATENT DOCUMENTS

| | | | |
|---|---|---|---|
| 2012/0132885 A1* | 5/2012 | Lippert et al. | .................... 257/9 |
| 2012/0298620 A1 | 11/2012 | Jiang et al. | |

FOREIGN PATENT DOCUMENTS

| | | |
|---|---|---|
| TW | 200538574 | 12/2005 |
| TW | 201247922 | 12/2012 |

* cited by examiner

*Primary Examiner* — Christopher Young
(74) *Attorney, Agent, or Firm* — Novak Druce Connolly Bove + Quigg LLP

(57) ABSTRACT

A method for making nanostructure is provided. The method includes following steps. A conductive layer including a graphene film is applied on an insulating substrate. A resist layer is placed on the conductive layer. A number of openings are formed by patterning the resist layer via electron beam lithography. A part of the conductive layer is exposed to form a first exposed portion through the plurality of openings. The first exposed portion of the conductive layer is removed to expose a part of the insulting substrate to form a second exposed portion. A preform layer is introduced on the second exposed portion of the insulating substrate. Remaining resist layer and remaining conductive layer are eliminated. A number of nanostructures are formed.

20 Claims, 5 Drawing Sheets

METHOD OF MAKING NANOSTRUCTURE

This application claims all benefits accruing under 35 U.S.C. §119 from China Patent Application No. 201310209010.1, filed on May 30, 2013 in the China Intellectual Property Office, the disclosure of which is incorporated herein by reference.

BACKGROUND

1. Technical Field

The present invention relates to methods for making nanostructure, particularly, to a method for making a nanostructure via electron beam lithography.

2. Description of Related Art

A method for making nanostructure via electron beam lithography includes following steps. First, a resist layer is applied on a surface of a substrate. Second, a part of the resist layer is exposed by an electron beam etching. Third, the exposed part of the resist layer is removed by a developing agent, and a patterned resist layer on the substrate is obtained. Fourth, the substrate can be further patterned through the patterned resist layer.

When the substrate is an insulated substrate, electric conductivity of the substrate is low, and a number of electrons would be accumulated on the surface of the substrate. In order to improve the electric conductivity of the substrate, an additive metal layer, such as Cr, is located on the surface of the substrate. However, atom weight of metal is relatively big, electrons would be scattered when meeting with the metal atom, that causing a boundary effect. Therefore, it is hard to form a nanostructure on the substrate with a high resolution.

What is needed, therefore, is a method for making nanostructure that can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
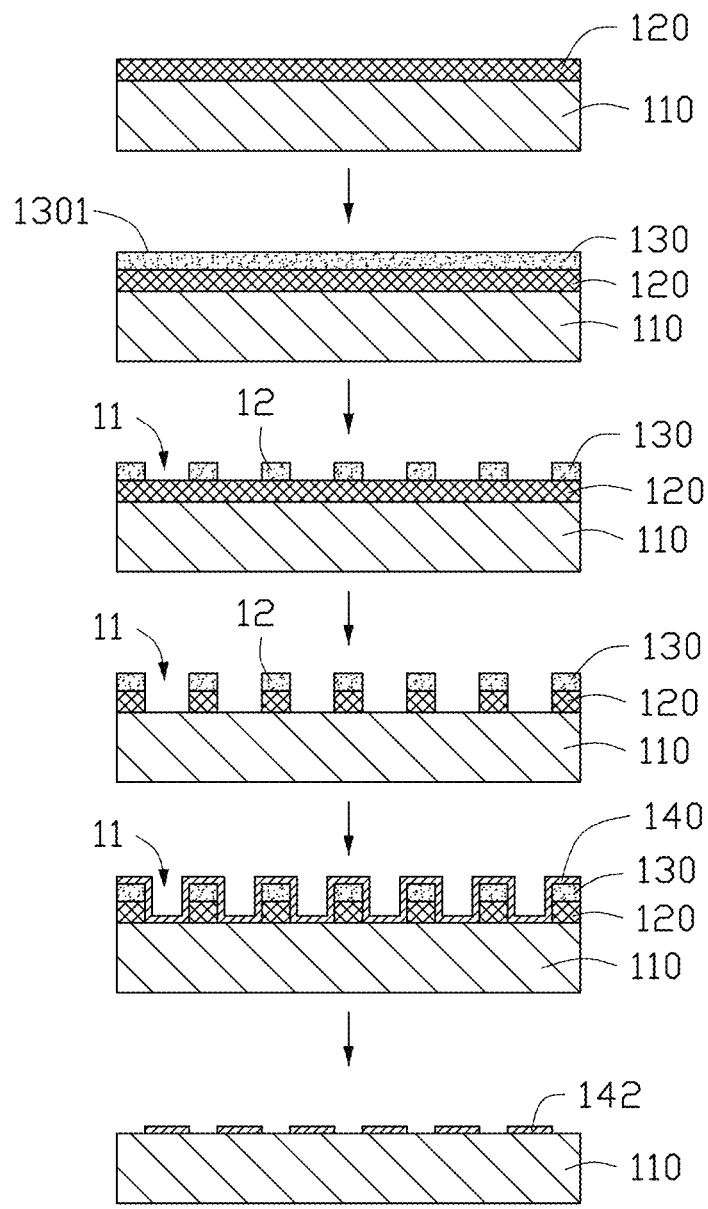
FIG. 1 is a flowchart of one embodiment of a method for making a nanostructure.

Referring to FIG. 1, a method for making nanostructure of one embodiment is provided. The method can be applied in fields of optical, thermal, electrical, and acoustic. The method includes following steps:

Step (S11), applying a conductive layer 120 on an insulating substrate 110, wherein the conductive layer 120 comprises a graphene film;

Step (S12), placing a resist layer 130 on the conductive layer 120;

Step (S13), forming a plurality of openings 11 by patterning the resist layer 130 via electron beam lithography, wherein a part of the conductive layer 120 is exposed through the plurality of openings 11 to form a first exposed portion;

Step (S14), removing the first exposed portion of the conductive layer 120 to expose a part of the insulting substrate 110 to form a second exposed portion;

Step (S15), introducing a preform layer 140 on the second exposed portion of the insulating substrate 110; and Step (S16), eliminating remaining resist layer 130 and remaining conductive layer 120, and forming a plurality of nanostructures 142, wherein the remaining resist layer is a residual part of the resist layer 130 after being patterned via electron beam lithography, the remaining conductive layer is a residual part of the conductive layer 120 after removing the first exposed portion of the conductive layer, and each of the plurality of nanostructures 142 is a protrusion.

In step (S11), the insulating substrate 110 has a property of electric insulation. The material of the insulating substrate 110 can be rigid materials, such as glass, crystal, ceramic, diamond, silicon dioxide, and silicon, or flexible materials such as plastic or resin. In detail, the flexible material can be polycarbonate (PC), polymethyl methacrylate acrylic (PMMA), polyethylene terephthalate (PET), polyethersulfone (PES), cellulose ester, polyvinyl chloride (PVC), benzocyclobutenes (BCB), acrylic resins, acrylonitrile butadiene styrene (ABS), polyamide (PA), or combination thereof. In one embodiment, the material of the insulating substrate 110 is silicon dioxide. The shape and size of the insulating substrate 110 are arbitrary.

The graphene film can include single-layer graphene or multilayer graphene. The single-layer graphene is a single-layer of continuous carbon atoms. The single-layer graphene is a one-atom thick sheet composed of a plurality of $sp^2$-bonded carbon atoms. When the graphene film includes multilayer graphene, a plurality of single-layer graphene can be stacked on each other or arranged coplanar side by side. The thickness of the graphene film can be in a range from about 0.34 nanometers to about 100 micrometers. For example, the thickness of the graphene film can be about 1 nanometer, about 10 nanometers, about 200 nanometers, about 1 micrometer, or about 10 micrometers. The single-layer graphene can have a thickness of a single carbon atom. In one embodiment, the graphene film includes a single-layer graphene, and the thickness of the graphene film is about a diameter of one atom.

The single-layer graphene has very unique properties. The thermal conductivity of the single-layer graphene is measured at $5300\ W \cdot m^{-1} \cdot K^{-1}$. A theoretical carrier mobility of the single-layer graphene is $2 \times 10^5\ cm^2 \cdot V^{-1} \cdot s^{-1}$. A resistivity of the single-layer graphene is $1 \times 10^{-6}\ \Omega \cdot cm$ which is about ⅔ of a resistivity of copper. And scattering-free transmissions can be observed on the single-layer graphene at room temperature.

The graphene film can be located on the insulating substrate 110 by transferring a preformed graphene film or a graphene powder on a surface of the insulating substrate 110. The graphene powder can present a continuous film structure when being transferred on the insulating substrate 110. The graphene film can be made by chemical vapor deposition, exfoliating graphite, electrostatic deposition, pyrolysis of silicon carbide, epitaxial growth on silicon carbide, or epitaxial growth on metal substrates. The graphene powder can be made by exfoliating graphite, cutting carbon nanotubes along length direction of carbon nanotubes, solvothermal synthesis, or organic synthesis.

In one embodiment, the conductive layer 120 is a pure graphene film. The graphene film is made by chemical vapor deposition. The method for making the graphene film includes following steps:

Step (S110), providing a metal substrate;

Step (S111), disposing the metal substrate in a reacting chamber, supplying a carbon source gas and a hydrogen gas into the reacting chamber, thereby forming a graphene film on the metal substrate; and Step (S112), cooling the metal substrate and the graphene film.

In step (S110), the metal substrate can be a metal foil with a thickness in a range from about 12.5 micrometers to about 50 micrometers. A material of the metal substrate can be copper or nickel. A shape of the metal substrate is not limited. An area of the metal substrate can be set according to a volume of a reacting chamber used to grow the graphene film by the CVD method. The metal substrate can be rolled up and placed in the chamber to grow the graphene film with a large area. In one embodiment, the metal substrate is a copper foil with a thickness of about 25 micrometers.

In step (S111), the reacting chamber can be a quartz tube. The carbon source gas and the hydrogen gas are supplied into the reacting chamber. A flow rate of the carbon source gas can be set according to a volume of a reacting chamber. A ratio between flow rates of the carbon source gas and the hydrogen gas is in a range from about 3:1. The carbon source gas can be at least one of methane, ethane, ethylene, or other hydrocarbons. While supplying the carbon source gas, the temperature in the reacting chamber can be in a range from about 800° C. to about 1100° C. with a constant temperature period in a range from about 5 minutes to about 30 minutes. A thickness of the graphene film is related to a pressure in the reacting chamber. The pressure in the reacting chamber can be in a range from about 66.7 Pa to about $10^5$ Pa.

In one embodiment, the pressure of the reacting chamber is about 66.7 Pa, the temperature of the reacting chamber is about 1000° C., the flow rate of the carbon source gas is about 25 standard-state cubic centimeter per minute (sccm), the carbon nanotube gas is methane, the constant temperature period is about 30 minutes, and the graphene film is a single-layer graphene.

In step (S112), while cooling the metal substrate, the carbon source gas and the hydrogen gas can be continuously flowed into the reacting chamber. The flow rate of the carbon source gas and the hydrogen gas and the pressure of the reacting chamber are constant. In one embodiment, the metal substrate is cooled for about 1 hour. After cooling the metal substrate, the metal substrate with the graphene film grown thereon is taken out of the reacting chamber.

The graphene film can be transferred on a surface of the insulating substrate 110 via an organic layer. The graphene film sustains the integrity of its structure after being transferred. The graphene film is transferred by following steps:

Step (a), applying an organic layer on the graphene film, and solidifying the organic layer;

Step (b), separating the organic layer and the graphene film from the metal substrate via a reagent;

Step (c), applying the organic layer and the graphene film on the insulating substrate 110; and Step (d), removing the organic layer via a first organic solvent.

Because the graphene film has a great surface tension, the graphene film can be firmly attached to the surface of the insulating substrate 110 via van der Waals force. Material of the organic layer can be polydimethylsiloxane (PDMS) or polymethylmethacrylate (PMMA). The reagent can react with the metal substrate to separate the metal substrate from the graphene film. The reagent can be ferric chloride, ferric nitrate and ammonium sulfite. The organic layer can be dissolved in and removed by the first organic solvent. In one embodiment, the reagent is ferric chloride, the material of the organic layer is PMMA, and the first organic solvent is acetone.

In step (S12), the resist layer 130 can be placed on the conductive layer 120 via a spin-coating method or a spray coating method. Material of the resist layer 130 can be hydrogen silsesquioxane (HSQ), positive electron-beam resist, or PMMA. In one embodiment, the PMMA is spray-coated on the conductive layer 120 at a speed of about 2000 rounds per minute (rpm) to about 7000 rpm, for about 0.5 minutes to about 2 minutes. A thickness of the resist layer 130 is in a range from about 20 nanometers to about 100 nanometers. The thickness of the first layer 130 should not be too big or too small. If the thickness of the resist layer 130 is too big, it is not easy to remove the resist layer 130. If the thickness of the resist layer 130 is too small, it is not easy to pattern the resist layer 130. In one embodiment, the thickness of the resist layer 130 is about 100 nanometers.

In step (S13), a working type of electron beam can be projecting or scanning In one embodiment, a first surface 1301 of the resist layer 130 away from the conductive layer 120 is scanned by electron beam step by step. The plurality of openings 11 are dented in to the resist layer 130 from the first surface 1301 and extend through the resist layer 130. Depth of the plurality of openings 11 is thickness of the resist layer 130. A bulge 12 is formed between neighboring two openings 11. A plurality of bulges 12 are formed on the conductive layer 120. Shape of the plurality of openings 11 can be circular, rectangular, diamond, regular hexagon, trapezoidal, or other irregular configuration. Width of the plurality of openings 11 is nanometer scale or micrometer scale. The plurality of openings 11 can be uniformly dispersed on the resist layer 130 such as being arranged in an array. The plurality of openings 11 can also be randomly dispersed.

A minimum of the width of the plurality of openings 11 is defined as a first resolution of the resist layer 130. The first resolution is in a range from about 20 nanometers to about 100 nanometers. In one embodiment, the first resolution is in a range from about 20 nanometers to about 40 nanometers. In the process of the electron beam lithography, because conductive property of the graphene film is great, electrons would be dispersed by the graphene film to prevent being accumulated at a point of the insulating substrate 110. Furthermore, diameter of carbon atoms of the graphene film is small, electrons would not be scattered when meeting with the carbon atoms. Thus, the boundary effect would be prevented, to ensure the first resolution of the resist layer 130 to less than 100 nanometers.

Figure 2:
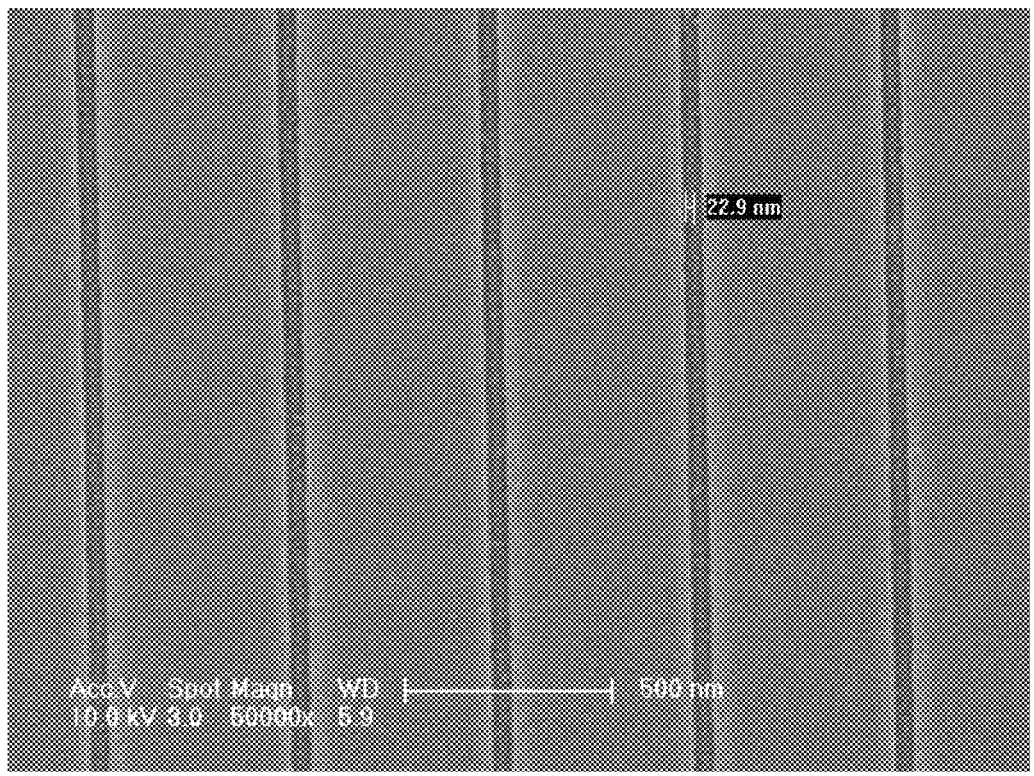
FIG. 2 is a Scanning Electron Microscope (SEM) image of one embodiment of a resist layer patterned via electron beam lithography.

Referring to FIG. 2, the plurality of openings 11 are configured as a plurality of grooves parallel with each other. The plurality of grooves extend along the same direction. The minimum of width of the plurality of grooves is about 22.9 nanometers.

In step S(14), the method of removing the conductive layer 120 comprises plasma etching and reactive ion etching. For example, the insulating substrate 110 with the conductive layer 120 and the plurality of openings 11 formed thereon can be placed in a reactive plasma etching system. Then, the reactive plasma etching system generates plasma, and the plasma moves towards the conductive layer 120 to etch away the first exposed portion of the conductive layer 120.

The plasma can be oxygen, chlorine, hydrogen, and so on. Power of the plasma system is in a range from about 10 watts to about 150 watts. Speed of the plasma is in a range from about 2 sccm to about 100 sccm. Partial pressure of the plasma is in a range from about 1 pascal (Pa) to about 15 Pa. Etching time is in a range from about 2 seconds to about 4 minutes.

In one embodiment, an $O_2$ reactive plasma etching method can be used to remove the first exposed portion of the conductive layer 120, the power of the plasma system is about 50 watts, the speed of the $O_2$ plasma is about 40 sccm, the partial pressure of the $O_2$ plasma is about 2 Pa, and the etching time is in a range from about 5 seconds to about 15 seconds. The $O_2$ plasma reacts with carbon atoms of the graphene film, and the graphene film exposed by the plurality of openings 11 is completely removed.

In step (S15), the introducing the preform layer 140 can comprise atomic layer deposition, vacuum evaporation, sputtering, or chemical vapor deposition (CVD). In one embodiment, the preform layer 140 is formed on the second exposed portion of the insulating substrate 110 via vacuum evaporation. The preform layer 140 can be a continuous layer covering both the plurality of bulges 12 and the second exposed portion of the insulating substrate 110. Also, the preform layer 140 can be formed on the second exposed portion of the insulating substrate 110 only. In one embodiment, the preform layer 140 is a continuous layer.

Material of the preform layer 140 is not limited. The material of the preform layer 140 can be copper, platinum, chromium, or silicon nitride. The preform layer 140 has a property of adhesion and can be firmly combined with the insulating substrate 110. Thus, in step of eliminating the remaining resist layer 130 and the remaining conductive layer 120, the preform layer 140 can attach to the second exposed portion of the insulating substrate 110. A thickness of the preform layer 140 is less than the thickness of the resist layer 130. The thickness of the preform layer 140 is in a range from about 20 nanometers to about 100 nanometers. In one embodiment, the material of the preform layer 140 is platinum and the thickness of the preform layer 140 is about 50 nanometers.

In step (S16), the remaining resist layer 130 can be eliminated via a second organic solvent. The second organic solvent can be acetone or resist remover. The remaining conductive layer 120 can be eliminated by a method of laser ablation, reactive ion etching, heating, or ultrasonic washing in water. In one embodiment, the remaining resist layer 130 is eliminated by acetone and the remaining conductive layer 120 is eliminated by ultrasonic washing in water.

When the preform layer 140 is the continuous layer, in the process of eliminating the remaining resist layer 130, a part of the preform layer 140 located on the remaining resist layer 130 can be eliminated simultaneously. Other part of the preform layer 140 that located on the second exposed portion of the insulating substrate 110 is remained, thereby forming the plurality of the nanostructures 142.

A pattern of the plurality of nanostructure 142 is similar to the pattern of the plurality of openings 11. A minimum width of the plurality of nanostructure 142 is defined as a second resolution. The second resolution is also similar to the first resolution of the plurality of openings 11. The conductive property of the graphene film is great and diameter of carbon atoms of the graphene film is small, thus the second resolution of the plurality of nanostructure 142 is less than 100 nanometers. The second resolution can be in a range from about 20 nanometers to about 100 nanometers. In one embodiment, the second resolution is in a range from about 20 nanometers to about 40 nanometers.

Figure 3:
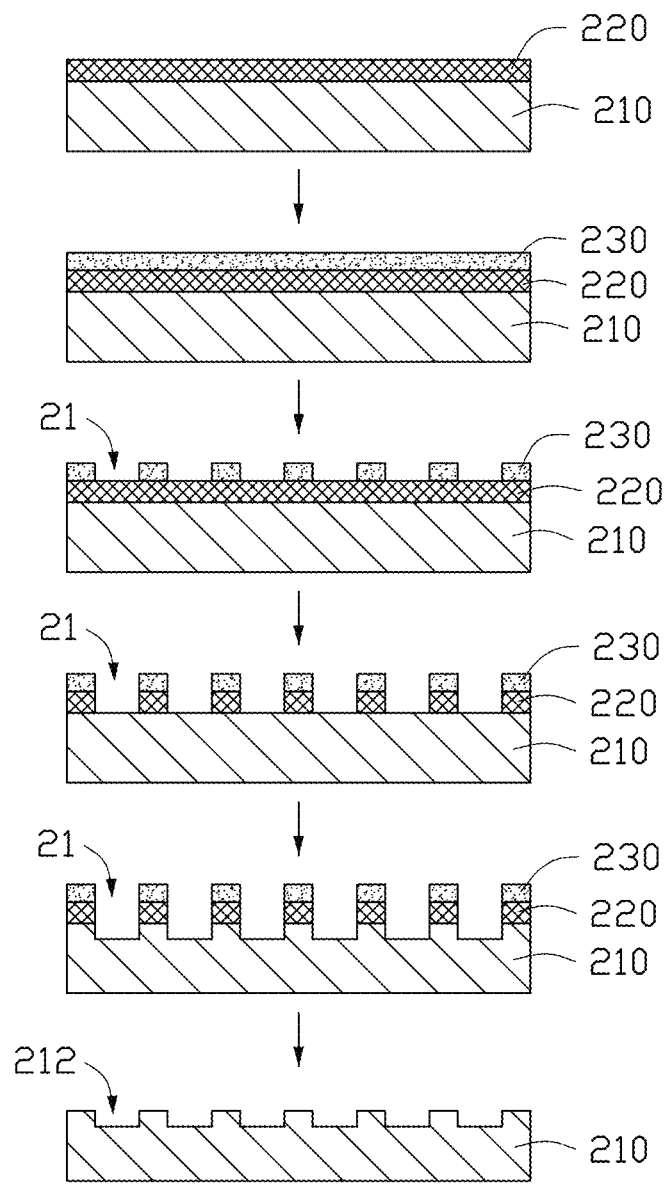
FIG. 3 is a flowchart of another embodiment of a method for making a nanostructure.

Referring to FIG. 3, a method for making nanostructure of another embodiment is provided. The method includes following steps:

Step (S21), applying a conductive layer 220 on an insulating substrate 210, wherein the conductive layer 220 comprises a graphene film;

Step (S22), placing a resist layer 230 on the conductive layer 220;

Step (S23), forming a plurality of openings 21 by patterning the resist layer 230 via electron beam lithography, wherein a part of the conductive layer 220 is exposed through the plurality of openings 21 to form a first exposed portion;

Step (S24), removing the first exposed portion of the conductive layer 220 to expose a part of the insulting substrate 210 to form a second exposed portion;

Step (S25), etching the second exposed portion of the insulating substrate 210, and forming a plurality of nanostructures 212, wherein each of the plurality of nanostructures 212 is a concave; and Step (S26), eliminating remaining resist layer 230 and remaining conductive layer 220, wherein the remaining resist layer is a residual part of the resist layer 230 after being patterned via electron beam lithography, and the remaining conductive layer is a residual part of the conductive layer 220 after removing the first exposed portion of the conductive layer.

The steps (S21) to (S24) and (S26) are similar with the steps (S11) to (S14) and (S16). In step (S25), the second exposed portion of the insulating substrate 210 can be etched by plasma etching or reactive ion etching. In one embodiment, the second exposed portion of the insulting substrate 210 is etched by plasma etching and the plasma is $SiCl_4$ and $Cl_2$. The plasma moves towards the conductive layer 220 to etch away the second exposed portion of the insulting substrate 210 to form the plurality of nanostructure 212. Size and shape of the plurality of nanostructure 212 are the same as those of the plurality of openings 21. A pattern of the plurality of nanostructure 212 is the same as a pattern of the plurality of openings 21.

Figure 4:
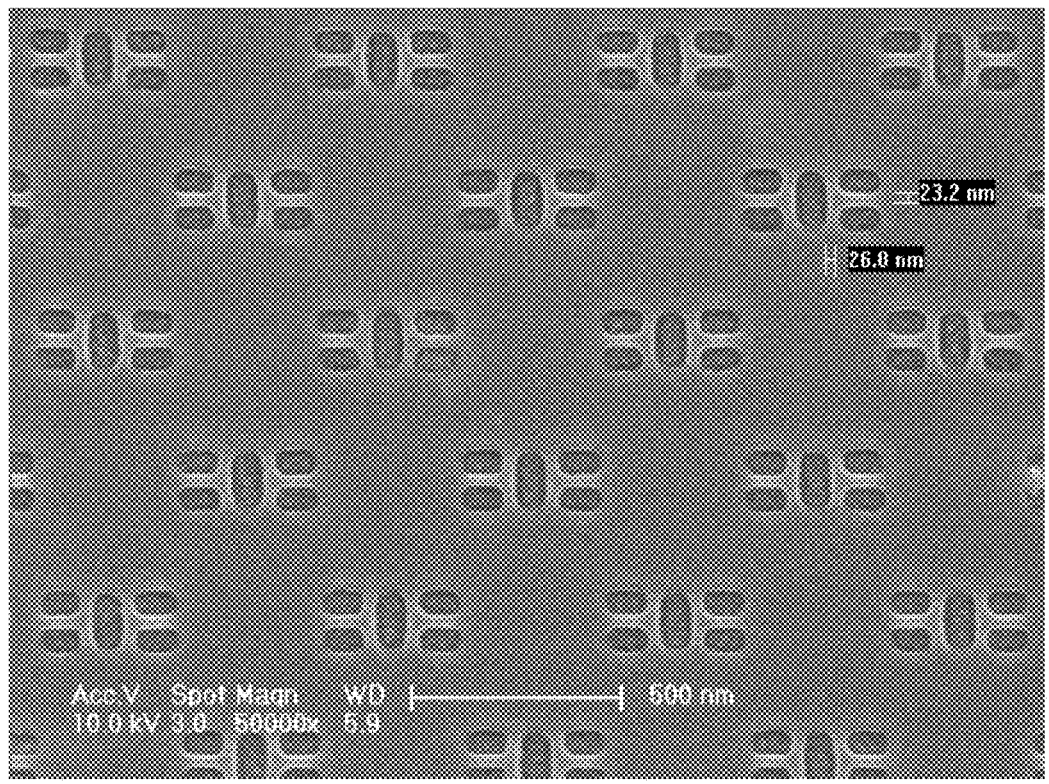
FIG. 4 is an SEM image of another embodiment of a resist layer patterned via electron beam lithography.

Referring to FIG. 4, the plurality of openings 21 are similar to a structure of butterfly. A minimum of a width of the plurality of openings 21 is about 23.2 nanometers. A resolution of the plurality of openings 21 can be about 23.2 nanometers. Thus, the plurality of nanostructure 212 can have a resolution of less than 23.2 nanometers.

Figure 5:
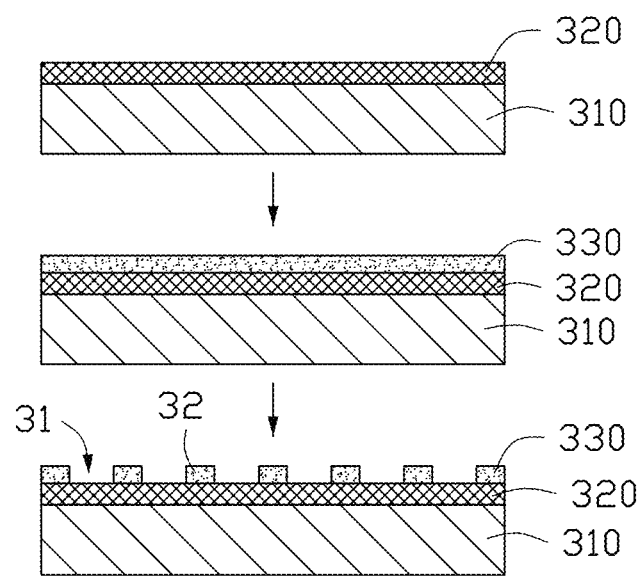
FIG. 5 is a flowchart of another embodiment of a method for making a nanostructure.

Referring to FIG. 5, a method for making nanostructure of another embodiment is provided. The method includes following steps:

Step (S31), applying a conductive layer 320 on an insulating substrate 310, wherein the conductive layer 320 comprises a graphene film;

Step (S32), placing a resist layer 330 on the conductive layer 320; and

Step (S33), forming a plurality of openings 31 by patterning the resist layer 330 via electron beam lithography, wherein a part of the conductive layer 320 is exposed through the plurality of openings 31.

The steps (S31) to (S33) are similar with the steps (S11) to (S13). The plurality of openings 31 have a resolution of less than 100 nanometers. The resolution of the plurality of openings 31 is in a range from about 20 nanometers to about 100 nanometers. In one embodiment, the resolution of the plurality of openings 31 is in a range from about 20 nanometers to about 40 nanometers.

The method for making nanostructure has following advantages. First, the conductive property of the graphene film is great and diameter of carbon atoms of the graphene film is relatively small, thus the plurality of nanostructure can have a resolution of less than 100 nanometers. Second, the graphene film can be removed easily, and the process is simplified. Third, the graphene film has great flexibility and can be applied on a flexible substrate.

Depending on the embodiments, certain of the steps described may be removed, others may be added, and the sequence of steps may be altered. It is also to be understood that the description and the claims drawn to a method may include some indication in reference to certain steps. However, any indication used is only to be viewed for identification purposes and not as a suggestion as to an order for the steps.

It is to be understood, however, that even though numerous characteristics and advantages of the present embodiments have been set forth in the foregoing description, together with details of the structures and functions of the embodiments, the disclosure is illustrative only, and changes may be made in detail, especially in the matters of shape, size, and arrangement of parts within the principles of the disclosure.

What is claimed is:

1. A method for making nanostructure comprising:
applying a conductive layer on an insulating substrate, wherein the conductive layer comprises a graphene film;
placing a resist layer on the conductive layer;
forming a plurality of openings by patterning the resist layer via electron beam lithography, wherein a part of the conductive layer is exposed through the plurality of openings to form a first exposed portion;
removing the first exposed portion of the conductive layer to expose a part of the insulting substrate to form a second exposed portion;
introducing a preform layer on the second exposed portion of the insulating substrate; and
eliminating remaining resist layer and remaining conductive layer, and forming a plurality of nanostructures, wherein the remaining resist layer is a residual part of the resist layer after being patterned via electron beam lithography, the remaining conductive layer is a residual part of the conductive layer after removing the first exposed portion of the conductive layer, and each of the plurality of nanostructures is a protrusion.

2. The method of claim 1, wherein a resolution of the plurality of nanostructures is in a range from about 20 nanometers to about 100 nanometers.

3. The method of claim 2, wherein a resolution of the plurality of nanostructures is in a range from about 20 nanometers to about 40 nanometers.

4. The method of claim 1, wherein the applying the conductive layer on the insulating substrate comprises following sub-steps:
placing a metal substrate in a reacting chamber;
supplying a carbon source gas and a hydrogen gas into the reacting chamber, thereby forming a graphene film on the metal substrate, wherein a ratio between flow rates of the carbon source gas and the hydrogen gas is in a range from about 3:1, a temperature in the reacting chamber is in a range from about 800° C. to about 1100° C. with a constant temperature period in a range from about 5 minutes to about 30 minutes, and a pressure in the reacting chamber is in a range from about 66.7 Pa to about $10^5$ Pa; and
transferring the graphene film from the metal substrate on the insulating substrate.

5. The method of claim 1, wherein the graphene film comprises a single-layer graphene.

6. The method of claim 1, wherein the removing the first exposed portion of the conductive layer is performed by a method of plasma etching or reactive ion etching.

7. The method of claim 1, wherein the eliminating the remaining conductive layer comprises laser ablation, reactive ion etching, heating, or ultrasonic washing in water.

8. The method of claim 1, wherein a pattern of the plurality of nanostructure is the same as a pattern of the plurality of openings.

9. The method of claim 1, wherein the insulating substrate comprises a material that is selected from the group consisting of polycarbonate, polymethyl methacrylate acrylic, polyethylene terephthalate, polyethersulfone, cellulose ester, polyvinyl chloride, benzocyclobutenes, acrylic resins, acrylonitrile butadiene styrene polyamide, and combinations thereof.

10. A method for making nanostructure comprising:
applying a conductive layer on an insulating substrate, wherein the conductive layer comprises a graphene film;
placing a resist layer on the conductive layer;
forming a plurality of openings by patterning the resist layer via electron beam lithography, wherein a part of the conductive layer is exposed through the plurality of openings to form a first exposed portion;
removing the first exposed portion of the conductive layer to expose a part of the insulting substrate to form a second exposed portion;
etching the second exposed portion of the insulting substrate, and forming a plurality of nanostructures, wherein each of the plurality of nanostructures is a concave; and
eliminating remaining resist layer and remaining conductive layer, wherein the remaining resist layer is a residual part of the resist layer after being patterned via electron beam lithography, and the remaining conductive layer is a residual part of the conductive layer after removing the first exposed portion of the conductive layer.

11. The method of claim 10, wherein a resolution of the plurality of nanostructures is in a range from about 20 nanometers to about 100 nanometers.

12. The method of claim 10, wherein a resolution of the plurality of nanostructures is in a range from about 20 nanometers to about 40 nanometers.

13. The method of claim 10, wherein the applying the conductive layer on the insulating substrate comprises following sub-steps:
placing a metal substrate in a reacting chamber;
supplying a carbon source gas and a hydrogen gas into the reacting chamber, thereby forming a graphene film on the metal substrate, wherein a ratio between flow rates of the carbon source gas and the hydrogen gas is in a range from about 3:1, a temperature in the reacting chamber is in a range from about 800° C. to about 1100° C. with a constant temperature period in a range from about 5 minutes to about 30 minutes, and a pressure in the reacting chamber is in a range from about 66.7 Pa to about $10^5$ Pa; and
transferring the graphene film from the metal substrate on the insulating substrate.

14. The method of claim 10, wherein the graphene film comprises a single-layer graphene.

15. The method of claim 10, wherein the etching the second exposed portion of the insulting substrate comprises a method of plasma etching or reactive ion etching.

16. The method of claim 10, wherein the removing the remaining conductive layer comprises laser ablation, reactive ion etching, heating, or ultrasonic washing in water.

17. A method for making nanostructure comprising:
   applying a conductive layer on an insulating substrate, wherein the conductive layer comprises a graphene film;
   placing a resist layer on the conductive layer; and
   forming a plurality of openings by patterning the resist layer via electron beam lithography, wherein a part of the conductive layer is exposed through the plurality of openings.

18. The method of claim 17, wherein a resolution of the plurality of openings is in a range from about 20 nanometers to about 100 nanometers.

19. The method of claim 17, wherein a resolution of the plurality of openings is in a range from about 20 nanometers to about 40 nanometers.

20. The method of claim 17, wherein the applying the conductive layer on the insulating substrate comprises following sub-steps:
   placing a metal substrate in a reacting chamber;
   supplying a carbon source gas and a hydrogen gas into the reacting chamber, thereby forming a graphene film on the metal substrate, wherein a ratio between flow rates of the carbon source gas and the hydrogen gas is in a range from about 3:1, a temperature in the reacting chamber is in a range from about 800° C. to about 1100° C. with a constant temperature period in a range from about 5 minutes to about 30 minutes, and a pressure in the reacting chamber is in a range from about 66.7 Pa to about $10^5$ Pa; and
   transferring the graphene film from the metal substrate on the insulating substrate.

\* \* \* \* \*